United States Patent
Leddige et al.

(10) Patent No.: US 7,194,572 B2
(45) Date of Patent: Mar. 20, 2007

(54) MEMORY SYSTEM AND METHOD TO REDUCE REFLECTION AND SIGNAL DEGRADATION

(75) Inventors: Michael W. Leddige, Beaverton, OR (US); James A. McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 334 days.

(21) Appl. No.: 10/638,069

(22) Filed: Aug. 8, 2003

(65) Prior Publication Data

US 2005/0033905 A1 Feb. 10, 2005

(51) Int. Cl.
*G06F 12/00* (2006.01)

(52) U.S. Cl. .......................... 711/105; 711/5; 711/100; 711/106

(58) Field of Classification Search .................... None
See application file for complete search history.

(56) References Cited

U.S. PATENT DOCUMENTS

| | | |
|---|---|---|
| 5,668,834 A | 9/1997 | Takekuma et al. |
| 6,125,419 A | 9/2000 | Umemura et al. |
| 6,757,755 B2 * | 6/2004 | Askar et al. ................... 710/52 |
| 6,882,082 B2 * | 4/2005 | Greeff et al. ................ 310/307 |
| 6,894,946 B2 * | 5/2005 | Jang ............................ 365/233 |
| 6,934,785 B2 * | 8/2005 | Lee et al. .................... 710/300 |

FOREIGN PATENT DOCUMENTS

WO WO 02/084428 A2 10/2002

OTHER PUBLICATIONS

International Search Report PCT/US2004/025220, May 2, 2005.

\* cited by examiner

*Primary Examiner*—T Nguyen
(74) *Attorney, Agent, or Firm*—Blakely, Sokoloff, Taylor & Zafman LLP

(57) ABSTRACT

Embodiments of the invention provide a memory command and address (CA) bus architecture that can accommodate higher CA data output frequencies with reduced signal degradation. For one embodiment of the invention the CA is divided on the motherboard and a CA signal component routed to each of two dual in-line memory modules (DIMMs) of a two-DIMM/channel memory bus design. The CA signal component on each DIMM is then routed sequentially through each dynamic random access memory (DRAM) chip on the respective DIMM. In one embodiment, after routing through each DRAM, the CA signal is terminated on the DIMM. In an alternative embodiment, the CA signal is terminated on the die at the last DRAM of each respective DIMM.

17 Claims, 4 Drawing Sheets

Appendix A
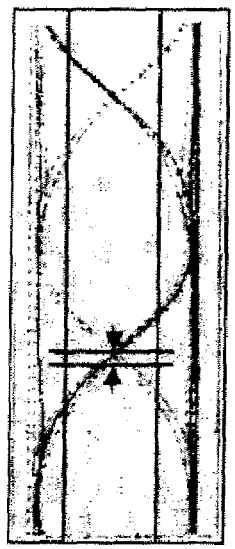
A2
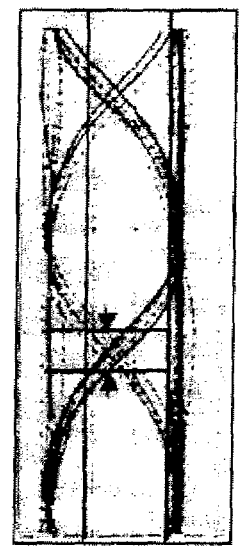
A4
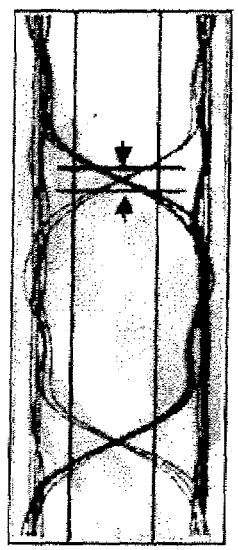
A1
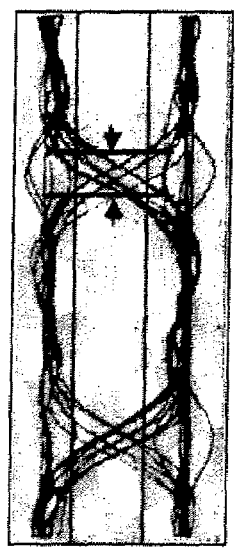
A3
Exemplary eye diagram waveforms using split T-chain CA bus topology

MEMORY SYSTEM AND METHOD TO REDUCE REFLECTION AND SIGNAL DEGRADATION

FIELD

Embodiments of the invention relate generally to the field of digital processing system memory architecture and more particularly to memory command and address bus topology.

BACKGROUND

Typical memory architectures have several drawbacks that limit their performance. This is due to the increasing data output frequencies for dynamic random access memory (DRAM). Synchronous DRAM (SDRAM) delivers data at high speed by using, among other things, an interface synchronized to the processor's internal clock. Therefore SDRAM has an output data frequency equal to the clock frequency. Double data rate (DDR) SDRAM provides data even faster by outputting data on the rising and falling edge of the clock, thus having an output data frequency of twice the clock frequency. For both SDRAM and DDR, the clock frequency is synchronous with the core frequency. For DDR II, the I/O buffers are clocked at twice the core frequency thereby providing an even greater output data frequency.

As the output data frequency increases, the signal integrity decreases. FIG. 1 illustrates a typical memory architecture in accordance with the prior art. Memory architecture 100, shown in FIG. 1, includes chipset 105. The chipset (core logic) 105 includes a memory controller 106 that controls the data flow between the system processor (not shown) and the system memory. The system memory may be contained on one or more dual in-line memory modules (DIMMs) 110. In such architecture, the command and address (CA) signals are propagated from the memory controller 106 along CA bus 108 to each DIMM 110. CA bus 108 may have, for example, eight parallel lines to propagate CA signals to the DRAM. On the board the CA signal is divided and routed to each DIMM. On each DIMM, the CA signals are successively divided to route to each DRAM over traces 109 as shown in FIG. 1. This successive division results in proportionately reduced CA signal components reaching each DRAM. Because the lengths of traces 109 are basically matched, the electrical delay to any DRAM is approximately the same. Therefore each reduced CA signal component hits the load of the respective DRAM at the same time substantially degrading each CA signal component. Additionally, the electrical reflection resulting from the trace pattern may result in interference. The extent of this interference depending upon the signal strength, and the ratio between the actual signal and the reflection.

The prior art architecture illustrated in FIG. 1 is acceptable at lower frequencies (e.g., 200 Mhz). However, as frequencies increase and the signal length becomes proportional to the physical length of the traces, the signal degradation becomes unacceptable.

The signal degradation described above has been addressed in several ways including changing the circuitry (e.g., additional resistors, duplicated lines (extra pins), etc.) and buffering the DIMM (adding extra logic chips to reduce the loading on the CA busses). These methods are costly as they amount to significant departures to industry standards for particular designs.

Another prior art memory architecture, direct Rambus™ DRAM (DRDRAM), increases data output frequency through use of a 16-bit bus (rather than the DRAM's 8-bit bus), and data pipelining. DRDRAM addresses the lumped load problem through a sequential routing scheme, but because the signal is routed through 32 DRAM chips, the signal strength eventually degrades. Additionally, the direct DRDRAM routing is across one DIMM to a connector on the motherboard and across the next DIMM, finally terminating on the motherboard, which requires additional pins at the connector. Moreover, routing through additional connectors causes signal degradation due to electrical reflection from the connectors as described above.

BRIEF DESCRIPTION OF THE DRAWINGS

The invention may be best understood by referring to the following description and accompanying drawings that are used to illustrate embodiments of the invention. In the drawings.

DETAILED DESCRIPTION

Embodiments of the invention provide a memory CA bus architecture that can accommodate higher CA data output frequencies with reduced signal degradation. For one embodiment of the invention the CA is divided on the motherboard and a CA signal component routed to each of two DIMMs of a two-DIMM/channel memory bus design. The CA signal component on each DIMM is then routed sequentially through each DRAM on the respective DIMM. In one embodiment, after routing through each DRAM, the CA signal is terminated at a termination point on the DIMM. In an alternative embodiment, the CA signal is terminated at a termination point on the die at the last DRAM of each respective DIMM.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
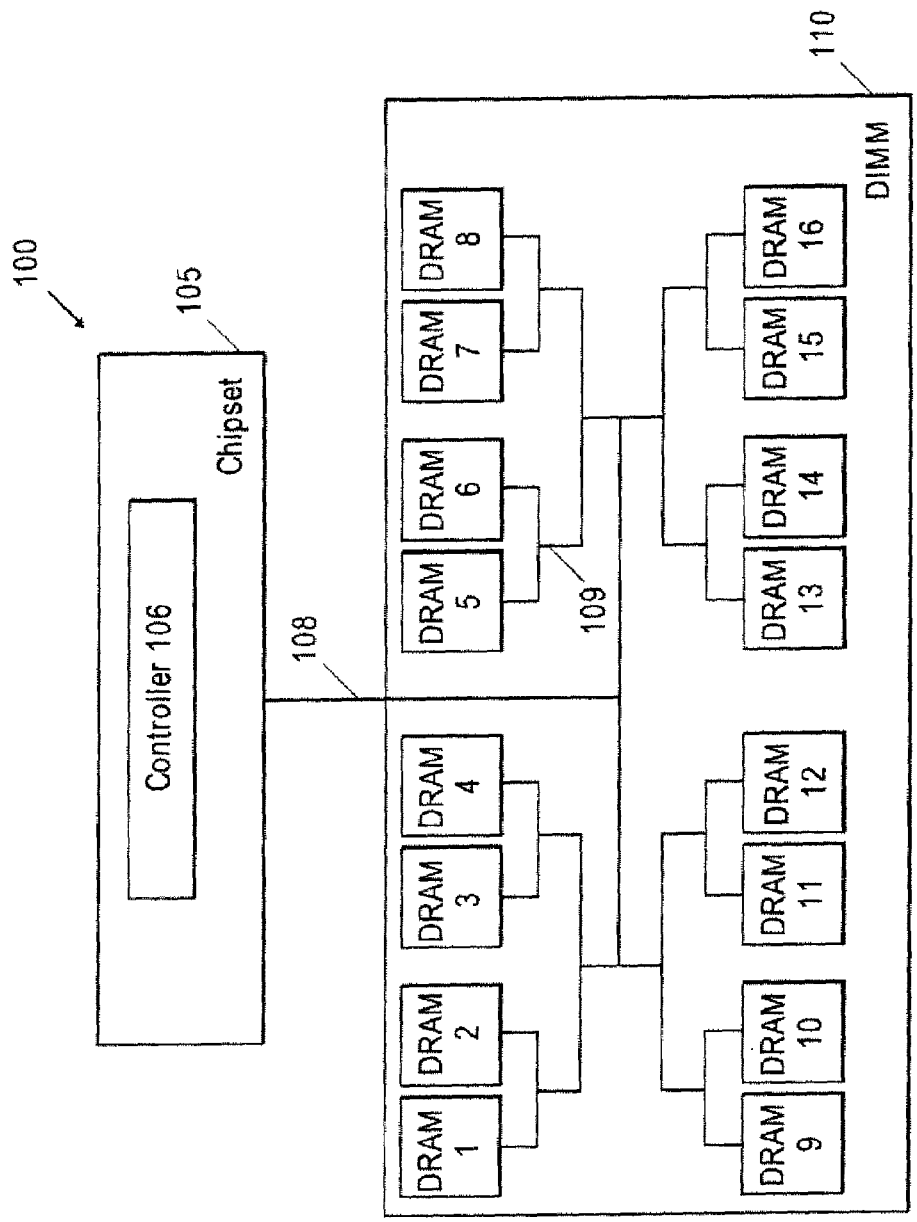
FIG. 1 illustrates a typical memory architecture in accordance with the prior art.
Figure 2:
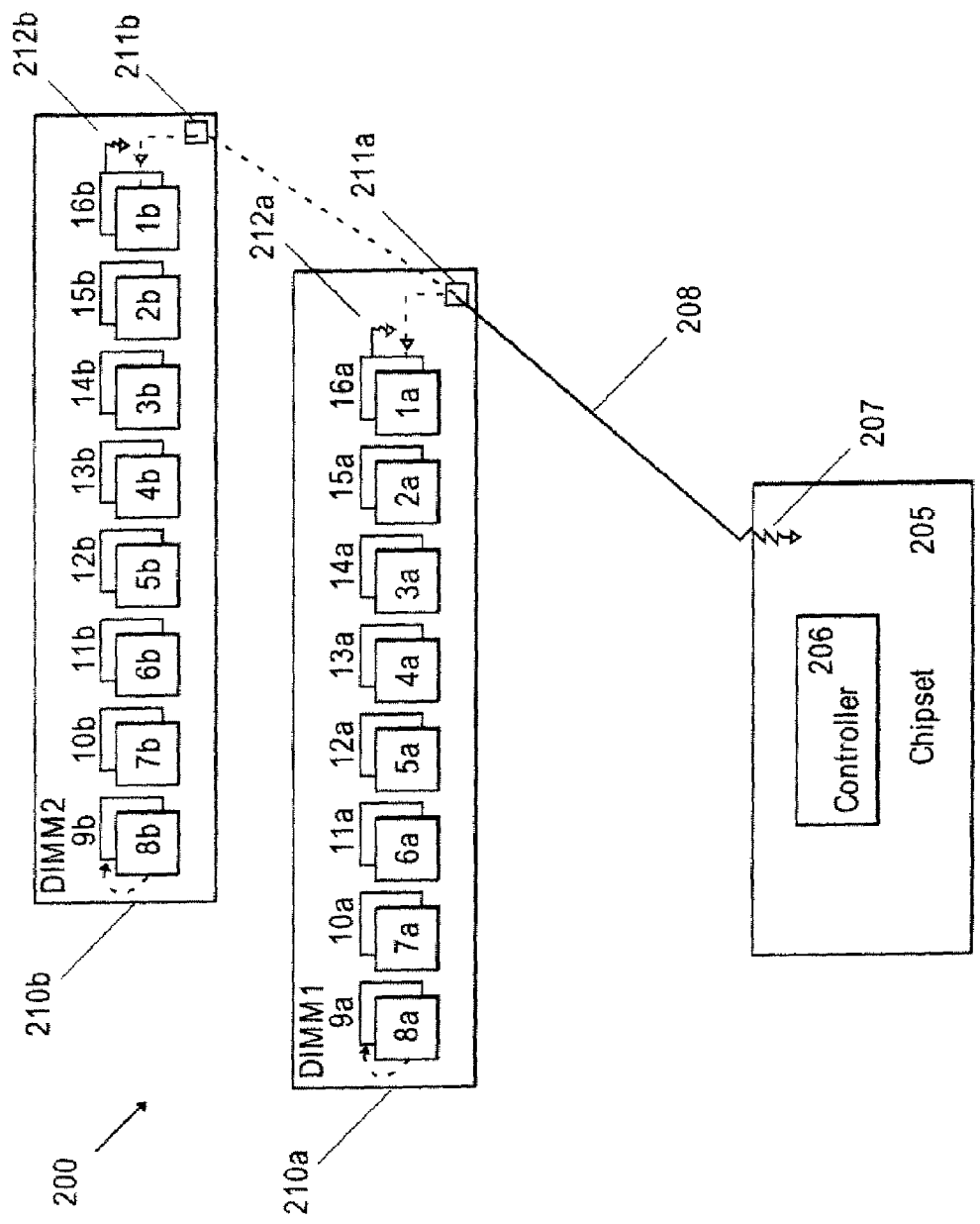
FIG. 2 illustrates a memory CA bus architecture in accordance with one embodiment of the present invention.

FIG. 2 illustrates a memory CA bus architecture in accordance with one embodiment of the present invention. Memory architecture 200, shown in FIG. 2, includes a chipset 205 coupled to DIMM 210a and DIMM 210b by a CA bus 208. The chipset 205 includes memory controller 206. During operation, the CA signal is routed to one side of DIMM 210a. FIG. 2 illustrates routing to the right side, however routing may be to the left side in alternative embodiments. On the motherboard, the CA signal is propagated from driver pin 207 on chipset 205 to connector pin 211a on DIMM 210a. At this point the CA signal is divided into two components. The first CA signal component is propagated through DRAMs 1a–16a on DIMM 210a starting with DRAM 1a. The first CA signal component is not further divided on DIMM 210a, but is propagated through each of DRAMs 1a–16a, one DRAM at a time. Therefore the load through which the signal propagates is a distributed load rather than a "lumped" load, as in prior art schemes. Upon propagation through each of the DRAMs on DIMM 210a, the signal terminates at termination point 212a on DIMM 210a. In alternative embodiments the termination point may be on the die of the last DRAM (e.g., DRAM 16a).

The second CA signal component is propagated to a connector pin 211b on DIMM 210b where it is similarly propagated through each DRAM, DRAMS 1b–16b, serially. Upon propagation through each of the DRAMs on DIMM 210b, the signal terminates at termination point 212b on DIMM 210b. Again, as noted, the termination point may be on the die of the last DRAM through which the signal has propagated. (e.g., DRAM 16b).

The load distribution through serial propagation of the CA signal components may require added logic. For example, added logic may be required to track the clock domain crossing due to the delay (time difference) between propagation of the signal through the first DRAM and propagation of the signal through the last DRAM (on each DIMM). For one embodiment, such added logic may be implemented on the chipset. In alternative embodiments the added logic may be implemented on the DRAM itself, or on both the chipset and the DRAM.

Impedance

As discussed above, mismatched impedance along the CA bus may result in reflections that degrade the CA signal. The CA bus topology in accordance with one embodiment of the invention, simplifies the routing of the CA signal across the DIMM as well as across the motherboard resulting in reduced signal reflection. Additionally, the CA bus topology in accordance with one embodiment of the invention provides greater flexibility for matching impedances. For one embodiment, the DRAM impedance and Bloch mode impedance for a given bandwidth is matched to the on-DIMM impedance which is greater than or equal to the mother board impedance. The chipset driver impedance is matched to the motherboard impedance and the DIMM termination point impedance is matched to the on-DIMM impedance.

The most significant parasitics are the interconnect resistance and interconnect (ground and coupling) capacitance, as well as substrate cross-talk. Interconnect parasitics are becoming the more significant concern, especially with multiple metal interconnect layers.

The CA bus architecture in accordance with one embodiment of the invention takes advantage of the small DRAM capacitive silicon loading and package to adjust the PCB routing to match a Bloch mode impedance across a given bandwidth as described above.

An estimate of DDRIII scaled parasitics would hit an on-DIMM impedance of approximately 50–60 Ohms and a motherboard impedance of approximately 25–50 Ohms. A data rate bandwidth in excess of 800 MT/s can be achieved with substantially the specifications of DDRII. Eye diagrams at 800 MT/s are included as Appendix A. Diagrams A1 and A2 illustrate the eye diagram for DRAMs 1 and 16, respectively, without crosstalk. Diagrams A3 and A4 illustrate the eye diagram for DRAMs 1 and 16, respectively, with crosstalk.

Figure 3:
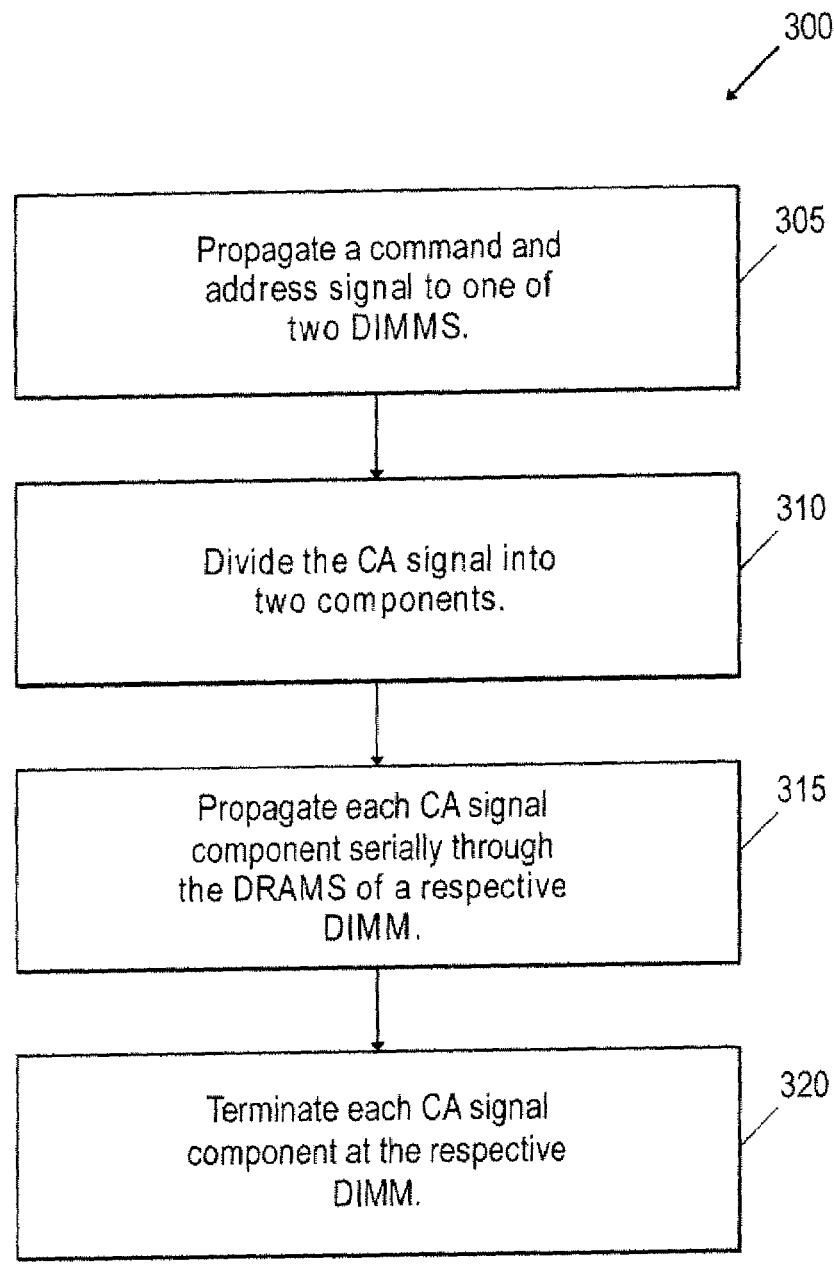
FIG. 3 illustrates a process in which CA signals are propagated from the memory controller to the system memory in accordance with one embodiment of the invention.

FIG. 3 illustrates a process in which CA signals are propagated from the memory controller to the system memory in accordance with one embodiment of the invention. Process 300, shown in FIG. 3, begins at operation 305 in which a CA signal is propagated from the memory controller to the first of two or more DIMMs.

At operation 310 the CA signal is divided into two or more components depending upon the number of DIMMs in the memory system (e.g., two), and each component is propagated to a respective DIMM.

At operation 315 the CA signal components at each DIMM are concurrently propagated to each DRAM of the respective DIMM. Each CA signal component is propagated serially starting with a DRAM on a specified side of the DIMM.

At operation 320 each CA signal component is terminated upon the DIMM. In an alternative embodiment of the invention, the CA signal component may be terminated on the die of the last DRAM to which the CA signal component was propagated.

General Matters

Embodiments of the invention provide a CA bus architecture suited for a two DIMM/channel memory bus design common in Desktop and Mobile platforms. In alternative embodiments, the CA bus architecture may be applied to other memory bus designs. The CA bus architecture in accordance with one embodiment, increases CA bandwidth without a significant departure from existing industry standards. For one embodiment, the pin count is minimized and with only a slight increase in logic complexity.

For one embodiment, the channel design is optimized to take advantage of the unidirectional bus CA DRAM parasitics to improve the channel bandwidth by a factor of eight over prior art CA topology schemes.

For one embodiment of the invention the on-Dimm routing and motherboard routing is simplified providing the flexibility to adjust the impedances to provide optimized voltage swing and minimal reflections, and thus higher performance.

In reference to FIG. 2, the order of propagation of the CA signal is described as initially proceeding through all of the DRAMs on the front side of DIMM 210a (i.e., DRAMs 1a-8a) and then continuing through all of the DRAMs on the back side of DIMM 210a (i.e., DRAMs 9a-16a). In alternative embodiments, the propagation of the CA signal may instead alternate from a front-side DRAM to a back-side DRAM or vice versa. For example, the propagation of the CA signal start at DRAM 1a, proceed to DRAM 16a, and alternate from front-side DRAMs to back-side DRAMs, finally terminating on or near DRAM 9a.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A memory system architecture comprising:
   a memory controller;
   a plurality of memory modules, each memory module containing a plurality of memory chips, wherein the plurality of memory modules comprises two memory modules and the plurality of memory chips comprises sixteen memory chips;
   a command and address bus coupling the memory controller to each of the plurality of memory modules such that a command and address signal propagated from the memory controller to one of the memory chips is propagated to a first memory module, divided into components, each component corresponding to one of the plurality of memory modules, each component propagated serially to each of the plurality of memory chips of the corresponding memory module, wherein a first impedance between a connector on the memory controller and a connector on the first memory module is less than a second impedance through a memory module.

2. The memory system architecture of claim 1 wherein each memory module is a dual in-line memory module and each memory chip is a dynamic random access memory chip.

3. The memory system architecture of claim 2 wherein the command and address bus is a unidirectional address bus.

4. The memory system architecture of claim 3 wherein the command and address signal is propagated from a pin on a chipset containing the memory controller to a pin on the first memory module.

5. The memory system architecture of claim 1 wherein each component is terminated at a signal termination point on the corresponding memory module after propagating serially through each of the plurality of memory chips.

6. A memory system architecture comprising:
   a memory controller;
   a plurality of memory modules, each memory module containing a plurality of memory chips;
   a command and address bus coupling the memory controller to each of the plurality of memory modules such that a command and address signal propagated from the memory controller to one of the memory chips is propagated to a first memory module, divided into components, each component corresponding to one of the plurality of memory modules, each component propagated serially to each of the plurality of memory chins of the corresponding memory module, wherein a first imoedance between a connector on the memory controller and a connector on the first memory module is less than a second impedance through a memory module, wherein each component is terminated at a signal termination point on a die of a last memory chip after propagating serially through each of the plurality of memory chips of the corresponding memory module.

7. A method comprising:
   propagating a command and address signal over a command and address bus to one of a plurality of memory modules, each memory module containing a plurality of memory devices;
   dividing the command and address signal into a plurality of components, each component corresponding to one of the plurality of memory modules; and
   propagating each component, serially to each of the plurality of memory devices of the corresponding memory module, wherein a first impedance between a connector on a memory controller and a connector on the first memory module is less than a second impedance through a memory module, wherein each memory module is a dual in-line memory module and each memory device is a dynamic random access memory device.

8. The method of claim 7 wherein the command and address bus is a unidirectional address bus.

9. The method of claim 8 wherein the command and address signal is propagated from a pin on a chipset containing the memory controller to a pin on the first. memory module.

10. The method of claim 7 wherein the plurality of memory modules comprises two memory modules and the plurality of memory devices comprises sixteen memory devices.

11. The method of claim 7 further comprising:
    terminating each component at a signal termination point on the corresponding memory module.

12. A method comprising:
    propagating a command and address signal over a command and address bus to one of a plurality of memory modules, each memory module containing a plurality of memory devices; dividing the command and address signal into a plurality of components, each component corresponding to one of the plurality of memory modules;
    propagating each component, serially to each of the plurality of memory devices of the corresponding memory module, wherein a first impedance between a connector on a memory controller and a connector on the first memory module is less than a second impedance through a memory module; and
    terminating each component at a signal termination point on a die of a last memory device.

13. A system comprising:
    a processor,
    a memory controller coupled to the processor;
    a command and address bus coupled to the memory controller, the command and address bus configured to propagate a command and address signal to one of a plurality of memory modules, divide the command and address signal into a plurality of components, each component corresponding to a memory module, and propagate each component, serially through each of a plurality of memory devices contained within the corresponding memory module, wherein a first impedance between a connector on the memory controller and a connector on the first memory module is less than a second impedance through a memory module,
    wherein each memory module is a dual in-line memory module and each memory device is a dynamic random access memory device, and wherein the command and address bus is a unidirectional address bus.

14. The system of claim 13 wherein the plurality of memory modules comprises two memory modules and the plurality of memory devices comprises sixteen memory devices.

15. The system of claim 13 wherein the command and address signal is propagated from a pin on a chipset containing the memory controller to a pin on the first memory module.

16. The system of claim 13 wherein
    each component is terminated at a signal termination point on the corresponding memory module.

17. The system of claim 13 wherein
    each component is terminated at a signal termination point on a die of a last memory device.

* * * * *

UNITED STATES PATENT AND TRADEMARK OFFICE
CERTIFICATE OF CORRECTION

| | | |
|---|---|---|
| PATENT NO. | : 7,194,572 B2 | Page 1 of 1 |
| APPLICATION NO. | : 10/638069 | |
| DATED | : March 20, 2008 | |
| INVENTOR(S) | : Leddige et al. | |

It is certified that error appears in the above-identified patent and that said Letters Patent is hereby corrected as shown below:

In column 5, at line 48, delete "impoedance" and insert --impedance--.

Signed and Sealed this

Twentieth Day of January, 2009

JON W. DUDAS
*Director of the United States Patent and Trademark Office*

UNITED STATES PATENT AND TRADEMARK OFFICE
CERTIFICATE OF CORRECTION

PATENT NO. : 7,194,572 B2  Page 1 of 1
APPLICATION NO. : 10/638069
DATED : March 20, 2007
INVENTOR(S) : Leddige et al.

It is certified that error appears in the above-identified patent and that said Letters Patent is hereby corrected as shown below:

In column 5, at line 48, delete "impoedance" and insert --impedance--.

This certificate supersedes the Certificate of Correction issued January 20, 2009.

Signed and Sealed this

Seventeenth Day of February, 2009

JOHN DOLL
*Acting Director of the United States Patent and Trademark Office*